United States Patent [19]

Gibson, Jr.

[11] Patent Number: 5,749,654
[45] Date of Patent: May 12, 1998

[54] CALORIMETRIC WATTMETER FOR TESTING MICROWAVE OVENS

[76] Inventor: Oliver E. Gibson, Jr., 1430 Solomon Rd., Santa Maria, Calif. 93455

[21] Appl. No.: 584,318

[22] Filed: Jan. 16, 1996

[51] Int. Cl.⁶ ........................................ G01K 17/00
[52] U.S. Cl. ........................................ 374/32; 324/95
[58] Field of Search ........................ 374/32, 141, 194, 374/198, 201; 324/95, 106

[56] References Cited

U.S. PATENT DOCUMENTS

| | | | |
|---|---|---|---|
| 612,518 | 10/1898 | Herbener | 374/198 |
| 2,261,826 | 11/1941 | Brown | 374/198 |
| 2,408,198 | 9/1946 | Coltman | 324/95 |
| 2,451,724 | 10/1948 | Evans | 324/95 |
| 3,040,252 | 6/1962 | Novak | 324/95 |
| 3,670,570 | 6/1972 | Briones et al. | 374/32 |
| 4,529,855 | 7/1985 | Fleck | 324/96 |
| 4,968,150 | 11/1990 | Mathews et al. | 374/32 |

FOREIGN PATENT DOCUMENTS

| | | | |
|---|---|---|---|
| 0362248 | 2/1973 | U.S.S.R. | 374/32 |
| 1009163 | 11/1965 | United Kingdom | 374/32 |

OTHER PUBLICATIONS

Scott, B., "Laser Energy Measurements with a Liquid Absorption Cell," J. Sci. Instrum., vol. 43, pp. 940–942 (1966).

Wharton, C., "Calorimetric Measurements of Single Pulse High-Power Microwaves in Oversized Waveguides," Dev. Sci. Instrum. vol. 57, No. 5, pp. 855–858 (May 1986).

Clogston, Abstract of Serial No. 608291, filed Aug. 1, 1945. Published in O.G. on Sep. 12, 1950.

Meahl, Abstract of Serial No. 706894, filed Oct. 31, 1946. Published in O.G. Sep. 26, 1950.

*Primary Examiner*—Diego F.F. Gutierrez
*Attorney, Agent, or Firm*—Stetina Brunda Garred & Brucker

[57] ABSTRACT

A device for measuring the microwave power produced by a microwave oven so as to determine whether the oven is producing its rated or set power, to prevent inadvertent undercooking of food, includes a calorimeter employing tap water as a working medium and a thermometer that can be set initially to read zero for any initial temperature of the working medium. In accordance with the invention, an enclosure containing a quantity of gaseous neon is connected to the calorimeter, and the gaseous neon glows only when radiation is present. The actual irradiation time, which may be less than the set cooking time due to start-up delay, may be accurately determined by timing the duration of the neon glow as observed through the window of the oven.

1 Claim, 2 Drawing Sheets

5,749,654

1

CALORIMETRIC WATTMETER FOR TESTING MICROWAVE OVENS

BACKGROUND OF THE INVENTION

1. Field of the Invention

The present invention is in the field of microwave power measurement and specifically relates to a calorimetric instrument for determining the microwave power generated by a microwave oven. The calorimetric method of measuring microwave power comprises the steps of permitting the microwaves to be absorbed by a suitable medium, such as a measured quantity of water, measuring the temperature rise in the medium, and relating the temperature rise to the microwave power. In brief, the temperature rise is proportional to the microwave power. The present invention is an improvement in the calorimetric method that results in a wattmeter that is especially well adapted for the testing of microwave ovens used in homes and restaurants.

These ovens generate microwave power levels that are nominally in the range of 400 to 1500 watts. However, the actual power generated may be less than the nominal or rated power due to deterioration of the components of the oven.

Knowing whether the microwave oven is operating at its rated output is a matter of serious concern to large restaurant chains as well as to serious home cooks.

2. The Prior Art

The underlying technique of using a calorimeter to measure microwave power is old, as can be seen from the following patents: U.S. Pat. No. 2,648,047 of Hollingsworth; U.S. Pat. No. 2,846,647 of MacPherson; U.S. Pat. No. 2,848,683 of Jones; and U.S. Pat. No. 2,866,950 of Smits. None of these patents describe an instrument that would be practical for use in testing microwave ovens.

A microwave oven wattage detector is described in U.S. Pat. No. 4,916,386 issued Apr. 10, 1990 to Schulz. Schulz describes a calorimeter consisting of a container holding a fluid in which there is immersed a liquid crystal thermometer. Such a thermometer is subject to inaccuracies due partly to its digital nature and partly to the difficulty in determining which of its elements is the most brightly lit.

Schulz teaches operating the microwave oven for a predetermined length of time when making the measurement. As is common knowledge, microwave ovens include a timer into which the user sets the desired cooking time and which limits the cooking time to the duration set in. When a calorimeter is used to check the operation of a microwave oven, as in Schulz, the duration of operation of the oven is set in this manner.

This method of determining the duration over which full microwave power is applied to the medium of the calorimeter is subject to an inaccuracy. As Schulz acknowledged, there is typically a delay, on the order of several seconds, between when the START button is pushed, and when the magnetron of the oven fires, producing the full microwave power. Schulz refers to such delays as minor, but Schulz is using measuring times on the order of 30 seconds. Clearly, as the ON time of the microwave oven is decreased, this source of error becomes more significant. In the present invention, ON times on the order of 10 seconds are contemplated, and a time delay of several seconds between the nominal time interval and the actual time interval becomes much more significant.

Another source of measurement error arises from variations in the initial temperature of the medium to be heated. In the present invention it is contemplated that the user will

2 fill the calorimeter with tap water immediately prior to making the measurement. This tap water may vary considerably in its temperature from one measurement to another. In U.S. Pat. No. 4,916,386, Schulz solves this problem by placing the apparatus in a refrigerator prior to use then bringing the apparatus out of the refrigerator and allowing the temperature to rise to a specific temperature, at which time the measurement is begun. This technique results in a constant starting temperature, but requires the extra step of chilling the medium.

Recognizing that only the increase in temperature is significant, in U.S. Pat. No. 2,648,047, Hollingsworth describes a dry calorimeter for use in measuring power levels in a waveguide. Hollingsworth teaches rotating of the thermometer scale relative to the pointer, so as to "zero" the thermometer before the measurement is started.

Regarding a different aspect of the present invention, it is noted that the use of a neon bulb or lamp as an indicator of the presence of microwave radiation is well known, and is described in the following patents: U.S. Pat. No. 3,748,424 of Fitzmayer; in U.S. Pat. No. 4,529,855 of Fleck; and in U.S. Pat. No. 2,408,198 of Coltman.

From the above discussion of the prior art it can be seen that existing microwave oven testers suffered from two main disadvantages. First, an initial chill-down in a refrigerator was needed to assure that the starting temperature was the same each time. Second, radiation times on the order of 30 seconds were used to minimize the error caused by delayed start-up of the magnetron.

SUMMARY OF THE INVENTION

Not satisfied with these difficulties that afflicted prior art microwave oven wattmeters, the present inventor set out to design an improved wattmeter that does not need to be chilled in a refrigerator before being used, that can use ON times as short as 10 seconds, and that eliminates the error caused by delayed firing of the magnetron of the microwave oven.

In accordance with the present invention, the need for chilling the apparatus initially (so that measurements can begin when its temperature has risen to a specific value) has been eliminated by providing a movable scale that can be slid until a reference mark on the scale has been brought into coincidence with the liquid-gas interface within the thermometer. That is, regardless of its actual temperature, the thermometer is set to read zero initially, at the beginning of the measurement. This requires only a second or two to accomplish, in contrast to the several minutes required in the prior art to chill the device in a refrigerator and then wait for it to return to a particular starting temperature. As noted above, Hollingsworth used the same technique in a laboratory calorimeter, but the present inventor was the first to grasp the advantages of this technique when it is applied to a small portable oven tester.

The major contribution of the present inventor was in finding a way of eliminating the effect of delayed starting of the magnetron. The effect of this delay is that after the START button has been pushed (starting the timed interval) several seconds typically elapse before the magnetron fires, and during the delay, no microwave power is supplied to the cooking chamber of the oven. As mentioned above, this delay of several seconds becomes a major source of error as the ON time of the oven is decreased.

To determine the amount of delay for a particular microwave oven, the present inventor incorporates a neon bulb into his device. The neon bulb does not light up until full microwave power is applied. In a preferred embodiment, the user simply notes how many seconds elapse before the neon bulb lights up during a preliminary run, and then adds this time to the nominal test time used for the actual measurement. Because the microwave power might not be uniformly distributed throughout the cooking chamber, it is important that the neon bulb be maintained in close proximity to the calorimeter fluid and the thermometer. In addition, because the neon bulb is built into the device, there is no risk that it will become misplaced.

As a result of these improvements made by the present inventor, the time required to test a microwave oven has been greatly reduced, while maintaining a high level of accuracy.

The novel features which are believed to be characteristic of the invention, both as to organization and method of operation, together with further objects and advantages thereof, will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

DETAILED DESCRIPTION OF THE PREFERRED EMBODIMENT

The present invention is concerned with the problem of determining whether a microwave oven is actually producing an amount of microwave power equal to its rated or nominal power. It is well known that such appliances fall short of their rated performance after a period of use due to aging of their components. This type of declining performance is of serious concern to restaurants as well as to serious amateur chefs.

In theory, the microwave power could be measured by several existing techniques, such as measuring voltages and currents in the circuitry, or by measuring electric and magnetic field strengths within the oven. However, the calorimetric technique used in the present invention has the advantages of not requiring interconnection to the circuitry of the oven and of measuring directly the heating ability of the oven, which, ultimately, is the matter of concern to the user.

All calorimeters have in common the use of an energy-absorbing medium and a temperature sensor for measuring the temperature rise in the energy-absorbing medium that results from absorbtion of energy. In the present invention, a measured mass of water is irradiated in the microwave oven, and a thermometer is used to measure the temperature rise that occurs in the water.

Figure 5:
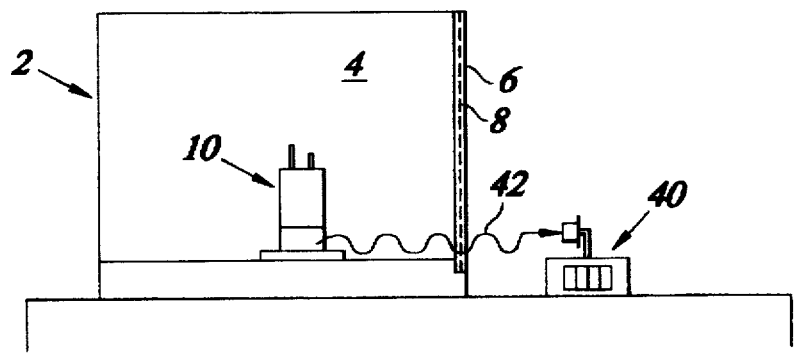
FIG. 5 is a diagram showing a radiation time measuring device used with the calorimetric wattmeter of the present invention.

The type of microwave oven with which the present invention is concerned is illustrated in FIG. 5. The microwave oven 2 includes a door 6 which is opened to permit food to be placed into a cooking chamber 4. The door includes a perforated screen 8 through which the food can be viewed while it is cooking. The perforations in the screen are so small that they do not permit the microwaves to pass through them and escape from the oven. The microwave oven includes a timer into which the user sets a nominal desired cooking time. The user then presses a START button on the oven which applies electric power to its circuitry. The circuitry typically includes a high voltage power supply that includes one or more capacitors and a magnetron that produces microwaves. When the capacitors have been charged up to a certain voltage, the magnetron fires and starts to produce the microwaves. Typically, a number of seconds elapse between the instant when the START button is pushed and the instant when the magnetron fires. This delay time $t_D$ becomes a major source of error when the microwave power is measured using short radiation times.

Almost universally the user energizes the microwave oven by pressing a START button, and this terminology is employed herein. Workers in the art will understand that pressing a START button is equivalent to actuating a START switch so as to apply electric power to the circuitry that produces the microwaves.

FIGS. 1–4 show several embodiments of the calorimetric wattmeter of the present invention. The calorimetric wattmeter, includes a body 12 of the material, such as plastic, that is relatively transparent to the microwave energy. In the preferred embodiment, the body 12 is injection molded and includes a base 14 for stability, a hollow chamber 16 containing gaseous neon, an upright vessel 17 containing a liquid 18 that absorbs microwaves, and a lid 20 or other structure used for supporting a thermometer 22 and a thermometer scale 24. The thermometer includes a sensor portion 26 that must be located where the temperature is to be measured and the thermometer also includes an indicator portion 28 that moves as the temperature changes.

The calorimetric wattmeter works in accordance with a simple theory. When the wattmeter is exposed to microwaves of a known intensity for a known actual time $t_A$, a certain rise in temperature of the liquid 18 occurs, resulting in a certain movement of the indicator portion 28 of the thermometer. To a good approximation, the temperature increase is directly proportional to the microwave intensity and to the actual duration of the radiation.

The initial temperature of the liquid 18 is not important because the quantity measured is the increase in temperature resulting from the radiation. For this reason, it is convenient to be able to move the thermometer scale 24 relative to the indicator portion 28 of the thermometer 22 so that the measurement always starts with the thermometer "zeroed". In this manner, if during a standard irradiation interval no microwave power is produced, the thermometer scale will correctly indicate zero microwave power. The marks on the thermometer scale indicate the movement of the indicator portion of the thermometer in response to exposures of equal duration to successfully greater amounts of microwave power, such as 100 watts, 200 watts, 300 watts . . . . Thus, the thermometer scale 24 reads directly in watts rather than in degrees of temperature.

FIGS. 1–4 show embodiments that reflect several different ways in which the thermometer can be zeroed initially.

In this preferred embodiment, both the thermometer 22 and its scale 24 are supported from the lid 20 so that the sensor portion 26 of the thermometer is maintained within the liquid 18.

In use, the upright vessel is filled with the microwave-absorbing liquid (water) and as the thermometer and scale are inserted into the vessel, some overflow is produced thereby assuring that exactly the same quantity of liquid is used in each measurement.

Figure 1:
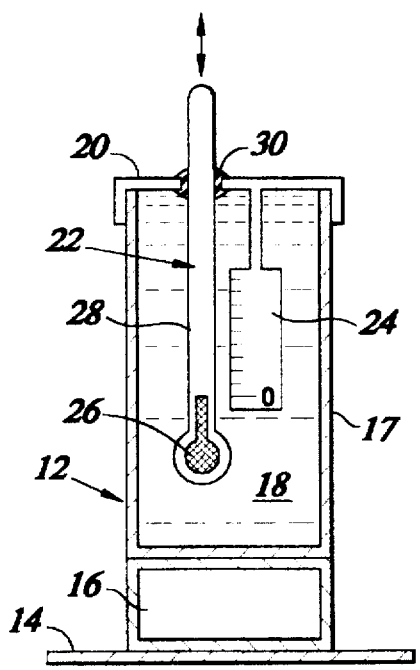
FIG. 1 is a diagram showing a side elevational view of a first preferred embodiment of the calorimetric wattmeter of the present invention.

In FIG. 1, the thermometer 22 is slidably mounted in a grommet 30 so that it can be moved vertically (as indicated by the arrow over the thermometer) to permit the indicator portion 28 to be aligned with the zero marker on the thermometer scale 24. The thermometer scale 24 is rigidly mounted to the lid 20.

Figure 2:
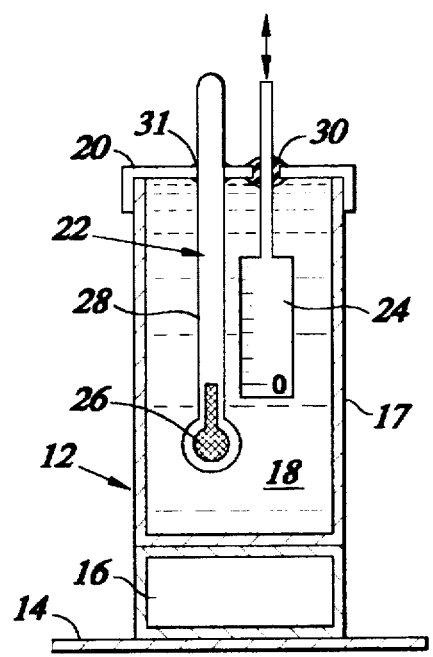
FIG. 2 is a diagram showing a second preferred embodiment thereof.

In FIG. 2, the thermometer scale 24 is mounted in a grommet 30 to facilitate its vertical movement, as indicated by the arrow above the thermometer scale. The thermometer 22 is attached to the lid 20 by a deposit 31 of a suitable bonding agent.

Figure 3:
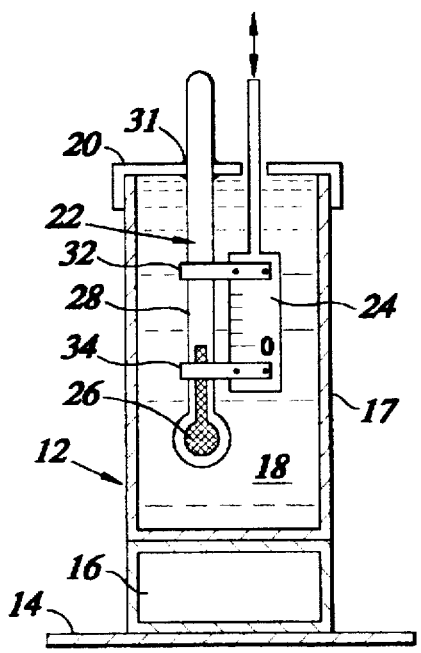
FIG. 3 is a diagram showing a third preferred embodiment thereof.

In FIG. 3, the thermometer scale 24 is mounted onto the thermometer by means of the clamps 32 and 34 which permits the thermometer scale to be moved as indicated by the arrow, so as to bring the zero mark on the thermometer scale into coincidence with the indicator portion 28 of the thermometer. The thermometer 22 is attached to the lid 20 by a deposit 31 of a suitable bonding agent.

Figure 4:
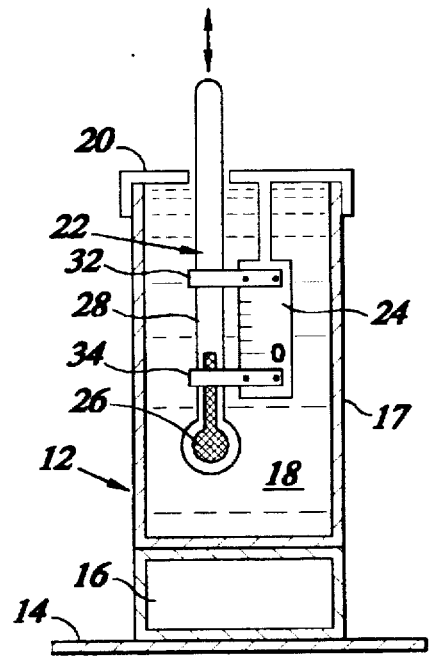
FIG. 4 is a diagram showing a fourth preferred embodiment thereof.

In FIG. 4, the thermometer scale 24 is rigidly mounted to the body (lid) of the wattmeter, and the thermometer is slidably mounted to the thermometer scale 24 by the clamps 32 and 34.

In the embodiment of FIGS. 1–4, the thermometer 22 and the thermometer scale 24 are attached, directly or indirectly to the lid 20 which is considered to be part of the body 12. Clearly, the thermometer 22 and the thermometer scale 24 could equally well be mounted on arms or brackets extending into the upright vessel 17, and in other embodiments this expedient is used. These alternative embodiments are considered to be within the scope and spirit of the present invention.

FIG. 5 is a diagram showing the calorimetric wattmeter 10 located inside the cooking chamber 4 of a microwave oven 2. The microwave oven 2 includes a door 6 that incorporates a perforated screen 8 that permits the user to view the food while it is cooking. The microwave oven also includes a START button that initiates the flow of power to the circuitry of the oven. The oven further includes a timer into which the user sets a desired nominal cooking time. The timer starts operating when the START button is pushed. As explained above, there is usually a time delay of several seconds between when the START button is pressed and when the magnetron begins to supply microwaves to the cooking chamber 4. The user of the wattmeter detects the presence of microwaves by observing the hollow chamber 16 through the perforated screen 8. The microwaves are not present until the neon gas within the hollow chamber 16 begins to emit its characteristic red visible light. Ordinarily, the user of the wattmeter has no difficulty in counting the number of seconds that elapse between when the START button is pushed and when the neon light comes on. This delay time is denoted herein by the symbol $t_D$. Because this time delay is of the nature of a correction to the nominal time $t_N$, there is no need to determine it with great precision, and ordinarily sufficient accuracy is achieved if the user simply estimates the delay time.

Figure 6:
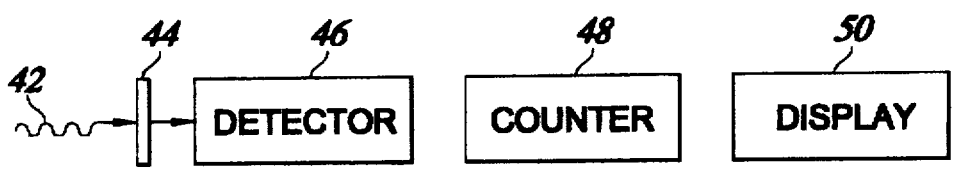
FIG. 6 is an electronic block diagram of the radiation measuring device shown in FIG. 5.

A more precise measurement of the delay time can be obtained, if necessary, by use of the irradiation timer 40 shown in FIGS. 5 and 6. The irradiation timer 40 is located outside of the cooking chamber 4 and hence is unaffected by the microwaves within the cooking chamber. Instead, the irradiation timer 40 receives some of the visible red light 42 emitted by the neon gas in the hollow chamber 16 of the wattmeter 10. As indicated in FIG. 6, the irradiation timer 40 includes a narrow bandpass filter 44 placed in front of a detector photocell 46 and in this way, the only light that the detector responds to is light having the color of the light emitted by the neon gas. In this way, the irradiation timer 40 can be operated in a fully lit room. The counter 48 counts only when the detector 46 is receiving the visible red light emitted by the neon gas. The counter 48 is incremented 100 times a second, so that the count indicates the actual irradiation time to the nearest hundredth of a second. This time is displayed on a suitable display 50.

Turning now to the procedural aspects of measuring the output power of a particular microwave oven, one must recognize the experimental fact that the delay time is initially unknown and may typically fall somewhere in the range from zero to several seconds. The marks on the thermometer scale 24 indicate the temperatures resulting from various microwave power levels during an actual standard irradiation time of, for example, 15 seconds.

In a first preferred procedure, the user fills the upright vessel 17 with tap water, zeros the thermometer manually so that the indicator portion coincides with the zero mark on the thermometer scale 24, places the wattmeter into the cooking chamber, inserts a nominal irradiation time (say 15 seconds) into the timer, presses the START button, and estimates the delay time (say 3 seconds). In this case the actual irradiation time is 15 seconds minus 3 seconds delay, which yields an actual irradiation time of only 12 seconds. In this first preferred procedure, the indicated microwave power level is then multiplied by 15/12 to find the true microwave power level.

In a second preferred procedure, a preliminary run is made to determine the delay time. For purposes of this preliminary run, only the hollow chamber 16 or some other transparent container filled with neon gas needs to be in the cooking chamber. A nominal irradiation time, chosen to be greater than the expected delay time, is set into the timer and the START button is pushed. The delay time is then estimated by the user, or alternatively it can be calculated as the difference between the nominal irradiation time and the actual irradiation time indicated by the irradiation timer 40. Once the delay time $t_D$ has been obtained from this preliminary irradiation, the thermometer is zeroed and the wattmeter is placed in the cooking chamber. This time, a nominal irradiation time equal to the standard irradiation time (say 15 seconds) plus the previously obtained delay time (say 4 seconds) is set into the timer and the START button is pushed. The actual irradiation time will then be the nominal time (say 19 seconds) minus the delay time (say 4 seconds), which exactly equals the standard irradiation time (15 seconds) that was used in establishing the markings on the thermometer scale. When this 2-step procedure is used, there is no need to correct the microwave power read on the thermometer scale.

To carry out the procedures of the present invention, it is not necessary for the neon gas container to be connected to the calorimeter. That is, the procedures of the present invention are considered to be protected by any patent that issues on this application regardless of whether the neon gas container is an integral part of the calorimetric wattmeter, or is a removable part of the wattmeter or is a completely separate part.

Thus, there has been described a calorimetric wattmeter for measuring the output power of a microwave oven. In a preferred embodiment the calorimetric wattmeter includes a calorimeter having a thermometer that can be zeroed to accommodate variations in the initial water temperature, and further includes a hollow chamber of a transparent material that contains gaseous neon.

There have also been described two procedures for measuring the output power of a microwave oven. In a first procedure, the oven is operated for a nominal time during which the user estimates or measures the delay time and from it the actual irradiation time. The indicated power level is then corrected by multiplying it by a factor equal to the standard irradiation time divided by the actual irradiation time. In a second procedure, the delay time is estimated in a preliminary step and is then added to a nominal time that equals the standard irradiation time, so that the actual irradiation time will equal the standard irradiation time, thereby permitting the indicated power level to be accepted without further correction.

The foregoing detailed description is illustrative of several embodiments of the invention, and it is to be understood that additional embodiments thereof will be obvious to those skilled in the art. The embodiments described herein together with those additional embodiments are considered to be within the scope of the invention.

What is claimed is:

1. A calorimetric wattmeter for testing microwave ovens, comprising in combination:

a calorimeter including
- a body including an upright vessel for holding a particular quantity of a liquid;
- a thermometer having a sensor portion and an indicator portion;
- a thermometer scale;
- first means connecting said thermometer to said body for holding the sensor portion of the thermometer in the liquid;
- second means connecting said thermometer scale to said body for permitting said thermometer scale to be moved relative to the indicator portion of said thermometer; and, an enclosure connected to said calorimeter and containing a quantity of gaseous neon.

* * * * *